United States Patent
Park et al.

(10) Patent No.: US 9,478,690 B2
(45) Date of Patent: Oct. 25, 2016

(54) SEMICONDUCTOR PHOTO-DETECTING DEVICE

(71) Applicant: Seoul Viosys Co., Ltd., Ansan-si (KR)

(72) Inventors: Ki Yon Park, Ansan-si (KR); Hwa Mok Kim, Ansan-si (KR); Kyu Ho Lee, Ansan-si (KR); Sung Hyun Lee, Ansan-si (KR); Hyung Kyu Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/922,946

(22) Filed: Oct. 26, 2015

(65) Prior Publication Data

US 2016/0043263 A1    Feb. 11, 2016

Related U.S. Application Data

(63) Continuation-in-part of application No. 14/496,998, filed on Sep. 25, 2014, now Pat. No. 9,171,986.

(30) Foreign Application Priority Data

Sep. 25, 2013 (KR) .................. 10-2013-0113854

(51) Int. Cl.
| | |
|---|---|
| *H01L 31/0328* | (2006.01) |
| *H01L 31/0336* | (2006.01) |
| *H01L 31/072* | (2012.01) |
| *H01L 31/109* | (2006.01) |
| *H01L 31/108* | (2006.01) |
| *H01L 31/0304* | (2006.01) |
| *H01L 31/0232* | (2014.01) |
| *H01L 31/18* | (2006.01) |

(52) U.S. Cl.
CPC ....... *H01L 31/108* (2013.01); *H01L 31/02322* (2013.01); *H01L 31/03044* (2013.01); *H01L 31/03048* (2013.01); *H01L 31/1848* (2013.01); *H01L 31/1856* (2013.01); *Y02E 10/544* (2013.01)

(58) Field of Classification Search
CPC .................... H01L 31/02021; H01L 31/1013; H01L 31/03044; H01L 31/03046; H01L 31/03048
See application file for complete search history.

(56) References Cited

U.S. PATENT DOCUMENTS

| | | |
|---|---|---|
| 2014/0183549 A1 | 7/2014 | Park et al. |
| 2015/0187970 A1* | 7/2015 | Curry ............... H01L 31/03044 250/552 |

FOREIGN PATENT DOCUMENTS

| | | |
|---|---|---|
| KR | 10-2006-0112428 | 11/2006 |
| KR | 10-2009-0062348 | 6/2009 |
| KR | 1020100104997 | 9/2010 |

OTHER PUBLICATIONS

Notice of Allowance issued on Feb. 3, 2016, in U.S. Appl. No. 14/584,732.

(Continued)

*Primary Examiner* — Hoai V Pham
(74) *Attorney, Agent, or Firm* — H.C. Park & Associates, PLC

(57) ABSTRACT

A photo-detecting device includes a first nitride layer, a light absorption layer disposed on the first nitride layer, and a Schottky junction layer disposed on the light absorption layer. According to a photoluminescence (PL) properties measurement of the photo-detecting device, a first peak light intensity is greater than a second peak light intensity, and the first peak light intensity is a peak light intensity of light emitted from the light absorption layer, and the second peak light intensity is a peak light intensity of light emitted from the first nitride layer.

16 Claims, 5 Drawing Sheets

(56) References Cited

OTHER PUBLICATIONS

Notification of Reason for Refusal issued on Dec. 14, 2015 in Korean Patent Application No. 10-2013-0165878.

Notice of Allowance issued on Aug. 5, 2015, in U.S. Appl. No. 14/496,998.
Non Final Office Action issued on Oct. 7, 2015, in U.S. Appl. No. 14/584,732.

* cited by examiner

SEMICONDUCTOR PHOTO-DETECTING DEVICE

CROSS-REFERENCE TO RELATED APPLICATIONS

This application is a Continuation-in-Part of U.S. patent application Ser. No. 14/496,998, filed on Sep. 25, 2014, which further claims priority from and the benefit of Korean Patent Application No. 10-2013-0113854, filed on Sep. 25, 2013. The entire disclosures of the above applications are incorporated by reference for all purposes as if fully set forth herein.

BACKGROUND

1. Field

Exemplary embodiments relate to a semiconductor photo-detecting device. More particularly, exemplary embodiments relate to a semiconductor photo-detecting device with excellent detection efficiency for a specific wavelength of light.

2. Discussion of the Background

Semiconductor photo-detecting devices operate on the principle that current is induced by illuminated light. In particular, semiconductor photo-detecting devices for detecting ultraviolet (UV) light may be used in a variety of fields, such as business, medical science, defense industry, communications, etc. The semiconductor photo-detecting devices are based on the principle that a depletion region is formed by the separation of electrons and holes within a semiconductor upon absorption of photons, and current is, thus, induced depending upon a flow of the electrons.

Semiconductor photo-detecting devices using silicon have been typically used in the art. However, the semiconductor photo-detecting devices may require high voltage for operation and have low detection efficiency. Particularly, when the semiconductor photo-detecting devices for detecting UV light are manufactured using silicon, photo-detection efficiency may decrease due to the silicon being sensitive not only to UV light but also to visible and infrared light. In addition, UV light detecting devices using silicon may be thermally and chemically unstable.

To address such issues, photo-detecting devices using nitride-based semiconductors have been developed. Photo-detecting devices using nitride-based semiconductors may have relatively high responsivity, high reaction rate, low noise level, and high thermal and chemical stability compared with photo-detecting devices using silicon. Photo-detecting devices using AlGaN, among nitride-based semiconductors, as a light absorption layer may show improved characteristics as a UV light detecting device.

Nitride-based semiconductor photo-detecting devices may be manufactured in a variety of structures, such as, photoconductors, Schottky junction photo-detecting devices, p-i-n photo-detecting devices, and the like. Among the various forms of nitride-based semiconductor photo-detecting devices, Schottky junction photo-detecting devices may include a substrate, a buffer layer on the substrate, a light absorption layer on the buffer layer, and a Schottky junction layer on the light absorption layer. Further, a first electrode and a second electrode may be arranged on the Schottky junction layer and the buffer layer or the light absorption layer, respectively. To use the Schottky junction photo-detecting device as a UV light detecting device, the light absorption layer may be formed of a nitride-based semiconductor having band gap energy capable of absorbing UV light. Accordingly, AlGaN may be used as a semiconductor substance in the light absorption layer. A GaN layer may be used as the buffer layer.

In a structure including an AlGaN light absorption layer and a GaN buffer layer, when the AlGaN light absorption layer has an Al composition of 25% or more, or a thickness of 0.1 µm or more, cracks may be generated in the light absorption layer, thereby causing a yield decrease. To prevent cracking in the light absorption layer, an AlN layer may be interposed between the GaN buffer layer and the AlGaN light absorption layer. Even in this case, photo-detection response may be reduced due to high energy band gap and insulation characteristics of the AlN layer. Specifically, when the thickness of the AlN layer is less than about 100 Å, photo-detection characteristics may be improved but it may be difficult to completely prevent cracks, and when the thickness of the AlN layer exceeds about 100 Å, cracks may be prevented, but photo-detection characteristics may be deteriorated.

In addition, GaN, InGaN, and AlGaN layers used as a light absorption layer in typical nitride-based semiconductor photo-detecting devices may have intrinsic defects and allow current flow in the devices in response to visible light, but not UV light due to such defects. In response, characteristics of the semiconductor photo-detecting device, a low UV-to-visible rejection ratio of about $10^3$ has been measured. That is, the typical semiconductor photo-detecting devices may allow low current flow in response to visible light but not UV light, thereby, deteriorating detection accuracy.

The above information disclosed in this Background section is only for enhancement of understanding of the background of the inventive concept, and therefore, it may contain information that does not form any part of the prior art that is already known in this country to a person of ordinary skill in the art.

SUMMARY

Exemplary embodiments provide a photo-detecting device having high photo-detection efficiency for light in a specific wavelength range, such as, a UV light wavelength range.

Exemplary embodiments provide a photo-detecting device including a light absorption layer with improved crystallinity and having high photo-detection efficiency for, for instance, UV light.

Additional aspects will be set forth in the detailed description which follows, and, in part, will be apparent from the disclosure, or may be learned by practice of the inventive concept.

According to exemplary embodiments, a photo-detecting device includes: a first nitride layer; a light absorption layer disposed on the first nitride layer; and a Schottky junction layer disposed on the light absorption layer, wherein, according to a photoluminescence (PL) properties measurement of the photo-detecting device, a first peak light intensity is greater than a second peak light intensity, and wherein the first peak light intensity is a peak light intensity of a light emitted from the light absorption layer, and the second peak light intensity is a peak light intensity of a light emitted from the first nitride layer.

According to exemplary embodiments, a method of manufacturing a photo-detecting device, the method includes: forming a first nitride layer; forming a low-current blocking layer including a multilayer structure on the first nitride layer; forming a light absorption layer on the low-current blocking layer; and forming a Schottky junction layer on the light absorption layer, wherein the low-current blocking layer is formed at a lower temperature than the light absorption layer.

As described above, exemplary embodiments provide a photo-detecting device with relatively low responsivity to visible light by including a low-current blocking layer. Accordingly, the photo-detecting device may have an improved UV-to-visible rejection ratio and achieve improved photo-detection efficiency and reliability.

In addition, exemplary embodiments provide a photo-detecting device that includes a light absorption layer having improved crystallinity and may reduce a micro-current induced by reaction to visible light.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and together with the description serve to explain the principles of the inventive concept.

DETAILED DESCRIPTION OF THE ILLUSTRATED EMBODIMENTS

Figure 1:
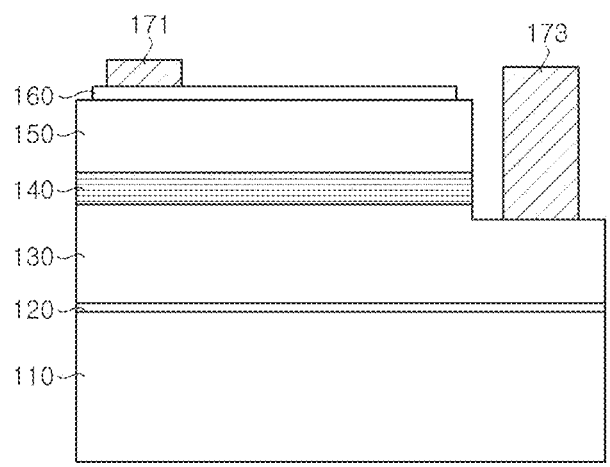
FIGS. 1 and 2 are, respectively, a sectional view and a top view of a photo-detecting device according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Illustrated as examples are composition ratios, growth methods, growth conditions, thicknesses, and the like, for semiconductor layers disclosed hereinafter, and the following descriptions do not limit the inventive concept disclosed herein. For example, for AlGaN, various composition ratios of Al and Ga may be used according to the need of those skilled in the art in the art. Furthermore, semiconductor layers disclosed hereinafter may be grown by various methods generally well-known to those skilled in the art, such as Metal Organic Chemical Vapor Deposition (MOCVD), Molecular Beam Epitaxy (MBE), Hydride Vapor Phase Epitaxy (HVPE), or the like. In the following exemplary embodiments, semiconductor layers are grown in the same chamber by MOCVD, and sources known to those skilled in the art according to composition ratios may be used as sources introduced into the chamber. However, it should be understood that the present invention is not limited thereto.

Figure 2:
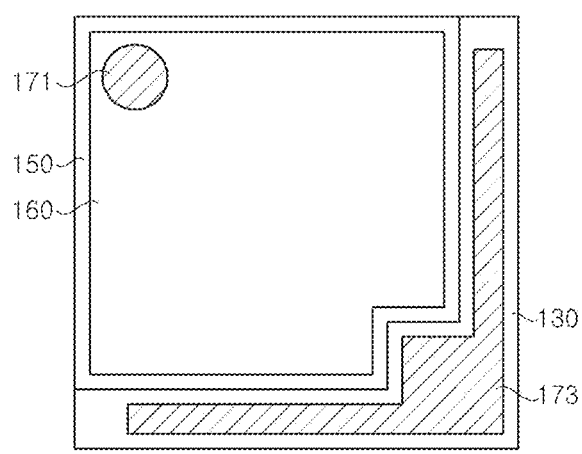

FIGS. 1 and 2 are, respectively, a sectional view and a top view of a photo-detecting device, according to exemplary embodiments.

Referring to FIGS. 1 and 2, a photo-detecting device includes a substrate 110, a first nitride layer 130, a low-current blocking layer 140, a light absorption layer 150, and a junction layer (e.g., Schottky junction layer) 160. In addition, the photo-detecting device may further include a second nitride layer 120, a first electrode 171, and a second electrode 173. Although specific reference will be made to this particular implementation, it is also contemplated that the photo-detecting device may embody many forms and include multiple and/or alternative components.

The substrate 110 is disposed at a lower side of the photo-detecting device, and any substrate enabling growth of semiconductor layers thereon may be used as the substrate 110. For example, the substrate 110 may include at least one of sapphire, SiC, ZnO, and a nitride-based substrate, such as GaN and AlN. As described, herein, the substrate 110 may include sapphire.

The first nitride layer 130 may be disposed on the substrate 110. The first nitride layer 130 may include a nitride-based semiconductor layer, for example, a GaN layer. The first nitride layer 130 may be doped with impurities, such as Si, to have n-type properties, or may be undoped. A nitride-based semiconductor may have characteristics of an n-type semiconductor even in an undoped state, and thus, doping of the nitride-based semiconductor may be determined as needed. When the first nitride layer 130 is doped with Si impurities to have n-type properties, a doping concentration of Si may be $1 \times 10^8$ or less. The first nitride layer 130 may have a thickness of about 2 μm.

The second nitride layer 120 may be disposed between the first nitride layer 130 and the substrate 110. The second nitride layer 120 may contain a substance similar to that of the first nitride layer 130, and, for example, may include GaN. The second nitride layer 120 may have a thickness of about 25 nm and may be grown at a lower temperature (for example, from 500° C. to 600° C.) than the first nitride layer 130. The second nitride layer 120 may serve to enhance crystallinity of the first nitride layer 130, whereby optical and electrical characteristics of the first nitride layer 130 may be improved by virtue of the second nitride layer 120. Further, when the substrate 110 is a heterogeneous substrate, such as a sapphire substrate, the second nitride layer 120 may also serve as a seed layer on which the first nitride layer 130 may be grown.

The low-current blocking layer 140 is disposed on the first nitride layer 130 and may have a multilayer structure. The multilayer structure of the low-current blocking layer 140 may include at least one of binary, ternary, and quaternary nitride semiconductor layers including (Al, In, Ga)N. Also, at least two nitride layers of the multilayer structure of the low-current blocking layer 140 may have different composition ratios than one another (or than at least one of the other layers of the multilayer structure). Each of the nitride layers may have a thickness of 5 nm to 10 nm, e.g., 6 nm to 9 nm, such as 7 nm to 8 nm. The multilayer structure of the low-current blocking layer 140 may have a structure in which three to ten pairs of nitride layers having different composition ratios are stacked.

Nitride semiconductor layers included in the multilayer structure of the low-current blocking layer 140 may be determined depending upon compositions of nitride layers in the light absorption layer 150. For example, when the light absorption layer 150 includes an AlGaN layer, the multilayer structure of the low-current blocking layer 140 may have a structure in which AlN/AlGaN layers and/or AlGaN/AlGaN layers are repetitively stacked. When the light absorption layer 150 includes an InGaN layer, the multilayer structure of the low-current blocking layer 140 may have a structure in which InGaN/InGaN layers, GaN/InGaN layers, and/or AlInGaN/AlInGaN layers are repetitively stacked, and when the light absorption layer 150 includes a GaN layer, the multilayer structure of the low-current blocking layer 140 may have a structure in which GaN/InGaN layers, InGaN/InGaN layers, and/or GaN/GaN layers are repetitively stacked.

Each of the nitride layers included in the low-current blocking layer 140 may have a different composition ratio by growing the nitride layers at different pressures. For example, if a multilayer structure of the low-current blocking layer 140 includes an $Al_xGa_{(1-x)}N$ layer and an $Al_yGa_{(1-y)}N$ layer repetitively stacked, the $Al_xGa_{(1-x)}N$ layer may be grown at a pressure of about 100 Torr and the $Al_yGa_{(1-y)}N$ layer may be grown at a pressure of about 400 Torr. When growth conditions are the same except for the pressure, the $Al_xGa_{(1-x)}N$ layer grown at a lower pressure may have a higher Al ratio than the $Al_yGa_{(1-y)}N$ layer grown at a higher pressure. It is contemplated, however, than any other suitable method may be utilized to control the various composition ratios of the various nitride layers.

According to exemplary embodiments, the nitride layers grown at different pressures may have different growth rates. As the nitride layers are grown at the different growth rates, it is possible to reduce propagation of dislocation or to change a propagation path of dislocation in the process of growth, thereby reducing dislocation concentration in other semiconductor layers to be grown in subsequent processes. Also, different composition ratios of the repetitively stacked layers may relieve stress caused by lattice mismatch, thereby enhancing crystallinity of the other semiconductor layers to be grown in the subsequent processes, and preventing damage such as cracks and the like. In particular, by growing an AlGaN layer having an Al ratio of 15% or more on the low-current blocking layer 140, cracks in the AlGaN layer may be reduced, thereby reducing cracks in the formation of the AlGaN layer on an AlN layer or a GaN layer. According to exemplary embodiments, since the low-current blocking layer 140 including the multilayer structure may be formed under the light absorption layer 150, the light absorption layer 150 may have enhanced crystallinity with reduced cracks therein. When the light absorption layer 150 has improved crystallinity, quantum efficiency of the photo-detecting device may be improved.

The low-current blocking layer 140 may have a higher defect concentration than the light absorption layer 150. This may be obtained by growing the low-current blocking layer 140 at a lower temperature than the light absorption layer 150. For example, the light absorption layer 150 may be grown at a temperature of about 1050° C. and the low-current blocking layer 140 may be grown at a lower temperature than the light absorption layer 150 by 30° C. to 200° C., e.g., 70° C. to 160° C., such as 100° C. to 130° C. When the low-current blocking layer 140 is grown at a lower temperature than the light absorption layer 150 by more than 200° C., crystallinity of the light absorption layer 150 formed on the low-current blocking layer 140 may be rapidly degraded, thereby decreasing quantum efficiency of the light absorption layer 150. Thus, the low-current blocking layer 140 may be grown at a lower temperature than the light absorption layer 150 by 30° C. to 200° C. When the low-current blocking layer 140 is grown at a lower temperature than the light absorption layer 150, the low-current blocking layer 140 may have a relatively higher concentration of defects, such as dislocation and vacancy, than the light absorption layer 150. Low-current blocking of the low-current blocking layer 140 will be described below in detail.

Referring back to FIG. 1, the light absorption layer 150 may be disposed on the low-current blocking layer 140.

The light absorption layer 150 may include a nitride semiconductor layer, including at least one of, but not limited to, a GaN layer, an InGaN layer, an AlInGaN layer, and an AlGaN layer. Since an energy band gap of the nitride semiconductor layer is determined depending upon the type of Group III element utilized, a substance for a nitride semiconductor of the light absorption layer 150 may be determined depending on the wavelength(s) of light to be detected by the photo-detecting device. For example, a photo-detecting device for detecting UV light in the UVA band may include the light absorption layer 150 including a GaN layer or an InGaN layer. A photo-detecting device for detecting UV light in the UVB band may include the light absorption layer 150 including an AlGaN layer having an Al ratio of 28% or less, and a photo-detecting device for detecting UV light in the UVC band may include the light absorption layer 150 including an AlGaN layer having an Al ratio of 28% to 50%, e.g., 33% to 45%, such as 38% to 40%. However, it should be understood that the present invention is not limited thereto.

The light absorption layer 150 may have a thickness of about 0.1 μm to about 0.5 μm, and may be formed to a thickness of 0.1 μm or more to improve photo-detection efficiency. When the light absorption layer 150 is formed on an AlN layer or a GaN layer, the light absorption layer 150 may suffer from cracking when the light absorption layer 150 including an AlGaN layer having an Al ratio of 15% is formed to a thickness of 0.1 μm or more. As such, device manufacturing yield and photo-detection efficiency may be reduced from a thin thickness of 0.1 μm or less of the light absorption layer 150. In contrast, according to exemplary embodiments, the light absorption layer 150 may be formed on the low-current blocking layer 140 including the multilayer structure, such that cracks may be reduced in the light absorption layer 150. In this manner, thereby the light absorption layer 150 may be manufactured to have a thickness of 0.1 μm or more. Accordingly, the photo-detecting device according to the exemplary embodiments may have improved photo-detection efficiency.

The Schottky junction layer 160 may disposed on the light absorption layer 150. The Schottky junction layer 160 and the light absorption layer 150 may make Schottky-contact with each other, and the Schottky junction layer 160 may include at least one of indium tin oxide (ITO), Ni, Co, Pt, W, Ti, Pd, Ru, Cr, and Au. The thickness of the Schottky junction layer 160 may be adjusted in terms of light transmittance and Schottky characteristics, and may be, for example, 10 nm or less.

In addition, the photo-detecting device may further include a cap layer (not shown) between the Schottky junction layer 160 and the light absorption layer 150. The cap layer may be a p-type-doped nitride semiconductor layer containing one or more impurities, such as Mg. The cap layer may have a thickness of 100 nm or less, e.g., 5 nm or less. The cap layer may improve Schottky characteristics of the device.

Referring back to FIG. 1, the photo-detecting device may include an exposed region of the first nitride layer 130 that may be formed by partially removing the light absorption layer 150 and the low-current blocking layer 140. The second electrode 173 may be disposed on the exposed region of the first nitride layer 130, and the first electrode 171 may be disposed on the Schottky junction layer 160.

The first electrode 171 may be a metal electrode including multiple layers, and may be formed from any suitable material. For example, the first electrode 171 may include at least one of a Ni layer and an Au layer stacked. The second electrode 173 may form ohmic-contact with the first nitride layer 130 and may include multiple metal layers formed from any suitable material. For example, the second electrode 173 may include at least one of a Cr layer, a Ni layer, and an Au layer stacked. It is contemplated, however, that any other suitable formations may be utilized in association with exemplary embodiments described herein.

Hereinafter, a role of the low-current blocking layer 140 according to an operating principle of the exemplary photo-detecting device will be described.

With an external power source connected to the first electrode 171 and the second electrode 173 of the photo-detecting device, the photo-detecting device may be prepared in a state in which voltage is not applied thereto or backward voltage is applied thereto. When light is radiated to the prepared photo-detecting device, the light absorption layer 150 absorbs the light. When the Schottky junction layer 160 is formed on the light absorption layer 150, an electron-hole separation region, namely, a depletion region is formed at an interface therebetween. Electrons created by the radiated light may induce a current and a photo-detecting function may be performed by measuring the induced current.

For example, when the photo-detecting device is a UV light detecting device, an ideal UV light detecting device has an infinite UV-to-visible rejection ratio. However, according to a conventional UV light detecting device, a light absorption layer responds also to visible light due to defects in the light absorption layer and generates electric current. Accordingly, the conventional photo-detecting device may have a UV-to-visible rejection ratio of $10^3$ or less, thereby causing an error in the optical measurement.

In contrast, according to exemplary embodiments, the low-current blocking layer 140 captures electrons created by visible light in the light absorption layer 150 to decrease the error from the device driven by the visible light. As described above, the low-current blocking layer 140 is grown at a lower temperature than the light absorption layer 150 to have a higher defect concentration. Electrons created by visible light are much fewer than electrons created by UV light, thereby the movement of the electrons created by visible light may be captured by defects present in the low-current blocking layer 140. That is, the low-current blocking layer 140 has such a higher defect concentration than the light absorption layer 150, thereby capturing movement of the electrons created by the visible light. Since the electrons created by UV light radiated onto the light absorption layer 150 are much more than those created by visible light, current may flow in the device, without being captured by the low-current blocking layer 140. Accordingly, the photo-detecting device of exemplary embodiments may have a higher UV-to-visible rejection ratio than the conventional UV light detecting device due to low responsivity to visible light. In particular, the photo-detecting device according to exemplary embodiments may have a UV-to-visible rejection ratio of $10^4$ or more. Therefore, the device may provide a photo-detecting device with high detection efficiency and reliability.

Figure 10:
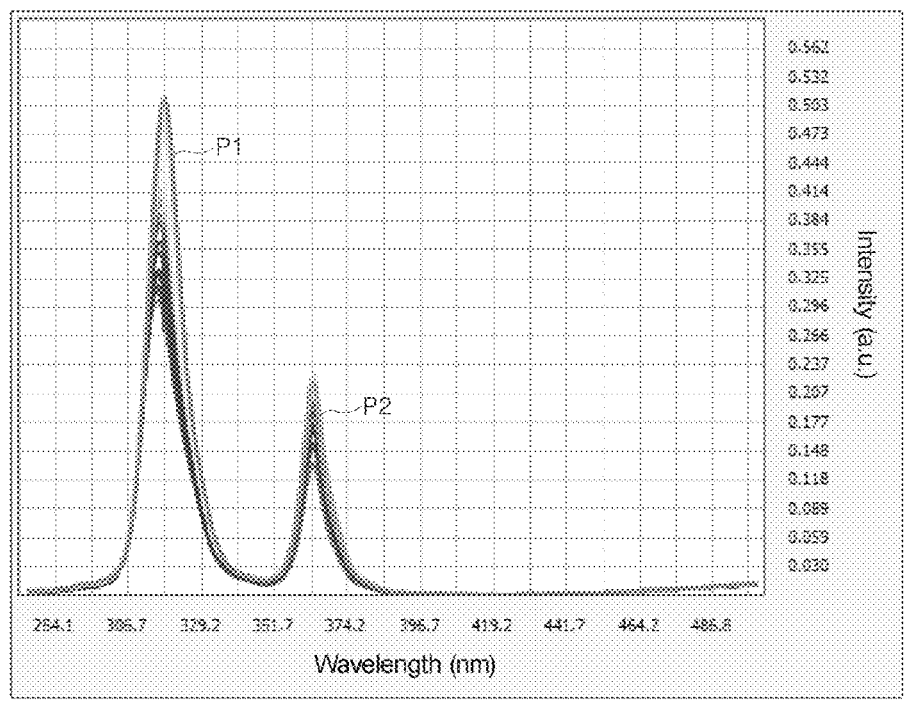
FIG. 10 is a graph illustrating results of measurement of photoluminescence (PL) properties of a photo-detecting device according to exemplary embodiments.

According to exemplary embodiments measuring photoluminescence (PL) properties of the photo-detecting device, peak intensity of light emitted from the first nitride layer 130 may be lower than that of light emitted from the light absorption layer 150. The PL properties are described in detail below with reference to FIGS. 10 and 11. FIG. 10 is a graph illustrating results of PL properties measurement of a photo-detecting device according to exemplary embodiments, and FIG. 11 is a graph illustrating results of the PL properties measurement of a photo-detecting device according to a comparative example.

Referring to FIG. 10, which illustrates the results of the PL properties measurement of a photo-detecting device according to exemplary embodiments, light having peak P1 is emitted from the light absorption layer 150 and light having peak P2 is emitted from the first nitride layer 130 upon irradiation with light (for example, a laser beam). The photo-detecting device showing the results of PL property measurement as shown in FIG. 10 may include the photo-detecting devices according to the above exemplary embodiments. A wavelength at the peak P1 and a wavelength at the peak P2 may substantially correspond to bandgap energy of the light absorption layer 150 and bandgap energy of the first nitride layer 130, respectively. For example, the light absorption layer 150 may include AlGaN and the first nitride layer 130 may include GaN. In addition, the first nitride layer 130 may have a greater thickness than the light absorption layer 150. Here, light used for the PL properties measurement may be a neodymium-doped yttrium aluminum garnet (Nd:YAG) pulsed laser beam, which may have a peak wavelength of about 266 nm and a power of about 5 mW. Referring to FIG. 10, according to the PL properties measurement of the photo-detecting device, peak P1 intensity of light emitted from the light absorption layer 150 may be greater than peak P2 intensity of light emitted from the first nitride layer 130. Further, the intensity of light at the peak P2 may be about 50% or less the intensity of light at the peak P1.

The photo-detecting device according to exemplary embodiments includes the low-current blocking layer 140 having relatively high defect density, whereby laser beams or photons applied for the PL property measurement can be blocked or trapped by defects of the low-current blocking layer 140. Accordingly, although the light absorption layer 150 may have a relatively smaller thickness than the first nitride layer 130, the peak P1 of light emitted from the light absorption layer 150 may be higher than the peak P2 of light emitted from the first nitride layer 130. Further, as low-current blocking effect of the low-current blocking layer 140 increases, laser beams or photons applied for the PL property measurement are more likely to be blocked or trapped by the defects of the low-current blocking layer 140. Thus, a ratio of the intensity of light at the peak P2 to the intensity of light at the peak (P1) may decrease as the low-current blocking effect of the low-current blocking layer 140 increases. When the intensity of light at the peak P2 is about 50% or less the intensity of light at the peak Pl, the low-current blocking layer 140 may have further enhanced low-current blocking effects.

Figure 11:
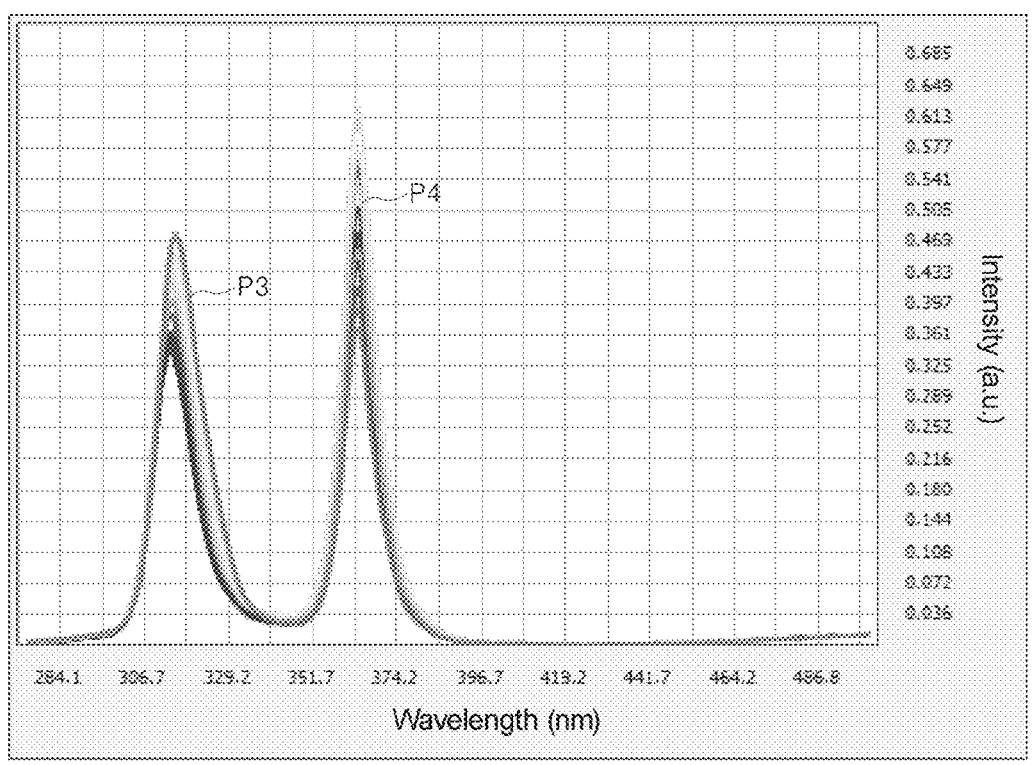
FIG. 11 is a graph illustrating results of measurement of PL properties of a photo-detecting device according to a comparative example.

Referring to FIG. 11, according to the PL properties measurement of a photo-detecting device according to a comparative example, peak P4 intensity of light emitted from the first nitride layer 130 is greater than peak P3 intensity of light emitted from the light absorption layer 150. The photo-detecting device according to the comparative example is substantially similar to the photo-detecting device according to the exemplary embodiments, but does not include the low-current blocking layer 140. In other words, the photo-detecting device according to the comparative example, which includes a first nitride layer 130 thicker than a light absorption layer 150 and does not include the low-current blocking layer 140, exhibits PL properties in which the intensity of light at the peak P4 is greater than the intensity of light at the peak P3.

In addition, the presence of the low-current blocking layer 140 may be identified or detected by comparing the peak intensity of the first nitride layer 130 with the peak intensity of the light absorption layer 150 through PL properties measurement.

FIGS. 3, 4, 5, 6, 7, and 8 are sectional views of a photo-detecting device at various stages of manufacture, according to exemplary embodiments. Duplicative descriptions of the same components as those described with reference to FIGS. 1 and 2 will be omitted.

Figure 3:
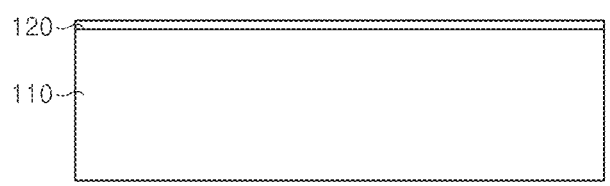
FIGS. 3, 4, 5, 6, 7, and 8 are sectional views of a photo-detecting device at various stages of manufacture, according to exemplary embodiments.

First, referring to FIG. 3, a second nitride layer 120 may be formed on a substrate 110. The second nitride layer 120 may include a nitride semiconductor and may be grown by MOCVD. For example, the second nitride layer 120 may be grown by injecting a Ga source and a N source into a chamber at 550° C. and 100 Torr. Accordingly, the second nitride layer 120 may include a GaN layer grown at low temperature. The second nitride layer 120 may be grown to a thickness of about 25 nm. The second nitride layer 120 grown to a small thickness at low temperature can provide improved crystallinity and optical and electrical characteristics to a first nitride layer 130 in the subsequent process.

Figure 4:
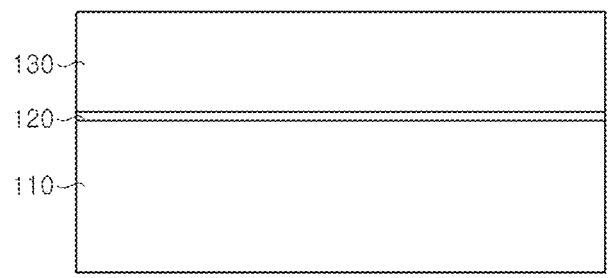

Next, referring to FIG. 4, the first nitride layer 130 is formed on the second nitride layer 120 by MOCVD. The first nitride layer 130 may include a nitride semiconductor and may be grown by MOCVD. For example, the first nitride layer 130 may be grown by injecting Ga source and N source into the chamber at 1050° C. and 100 Torr. In this manner, the first nitride layer 130 may include a GaN layer grown at high temperature. Furthermore, the first nitride layer 130 may include an n-type-doped GaN layer obtained by injecting an additional Si source into the chamber during growth of the first nitride layer 130, or may include an undoped GaN layer. The first nitride layer 130 may be grown with a thickness of about 2 μm.

Figure 5:
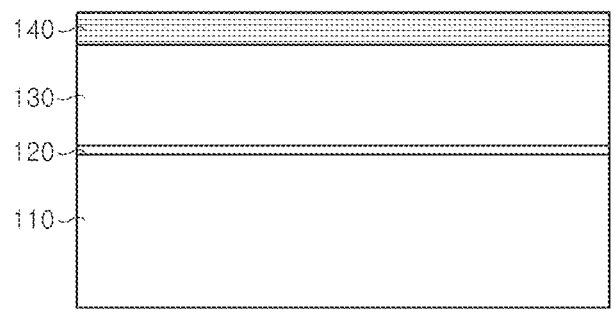

Referring to FIG. 5, a low-current blocking layer 140 is formed on the first nitride layer 130. The low-current blocking layer 140 may include a multilayer structure. Here, the multilayer structure may be formed by repetitively stacking at least one of binary, ternary, and quaternary nitride layers including (Al, In, Ga)N.

In exemplary embodiments, the multilayer structure of the low-current blocking layer 140 may include at least two nitride layers having different composition ratios. The nitride layers included in the multilayer structure of the low-current blocking layer 140 may be determined depending upon compositions of a nitride layer to be included in a light absorption layer 150. For example, when the light absorption layer 150 is to include an AlGaN layer, the multilayer structure of the low-current blocking layer 140 may have a structure in which AlN/AlGaN layers and/or AlGaN/AlGaN layers are repetitively stacked. When the light absorption layer 150 is to include an InGaN layer, the multilayer structure of the low-current blocking layer 140 may have a structure in which InGaN/InGaN layers, GaN/InGaN layers, and/or AlInGaN/AlInGaN layers are repetitively stacked. When the light absorption layer 150 is to include a GaN layer, the multilayer structure of the low-current blocking layer 140 may have a structure in which GaN/InGaN layers, InGaN/InGaN layers, and/or GaN/GaN layers are repetitively stacked. The multilayer structure of the low-current blocking layer 140 may be formed by stacking three to ten pairs of nitride layers, and the low-current blocking layer 140 may be formed to have a thickness of 10 nm to 100 nm.

Each of the at least two nitride layers having different composition ratios may be grown to a thickness of 5 nm to 10 nm, and may be grown to have a different composition ratio by regulating an inflow rate of a source. It is also contemplated that the at least two nitride layers having different composition ratios may be formed by stacking nitride layers at different pressures of the chamber while preserving other growth conditions (e.g. growth temperature) including the inflow rates of the sources. For example, when forming a multilayer structure in which an $Al_xGa_{(1-x)}N$ layer and an $Al_yGa_{(1-y)}N$ layer are repetitively stacked, the $Al_xGa_{(1-x)}N$ layer may be grown at a pressure of about 100 Torr and the $Al_yGa_{(1-y)}N$ layer may be grown at a pressure of about 400 Torr. Under the same growth conditions except for the pressure, the $Al_xGa_{(1-x)}N$ layer grown at a lower pressure may have a higher Al ratio than the $Al_yGa_{(1-y)}N$ layer grown at a higher pressure.

According to exemplary embodiments, the low-current blocking layer 140 including the multilayer structure grown at different pressures as described above may prevent (or otherwise reduce) the creation and propagation of dislocations during the growth process, thereby improving the crystallinity of the light absorption layer 150 formed on the low-current blocking layer 140. Furthermore, since the nitride layers grown at different pressures having different composition ratios are repetitively stacked, the stress caused, at least in part, by lattice mismatch may be decreased, thereby also reducing the generation of cracks in the light absorption layer 150. Moreover, since the nitride layers are grown by changing only the pressure while preserving the inflow rate of the source, it may be relatively easy to form the low-current blocking layer 140.

The multilayer structure of the low-current blocking layer 140 may be grown at a temperature between 850° C. and 1020° C. The growth temperature of the multilayer structure of the low-current blocking layer 140 may be 30° C. to 200° C. lower than that of the light absorption layer 150, and, therefore, the low-current blocking layer 140 can have a higher defect concentration than that of the light absorption layer 150. Accordingly, the low-current blocking layer 140 may capture the flow of electrons created by a reaction of the light absorption layer 150 to visible light.

Figure 6:
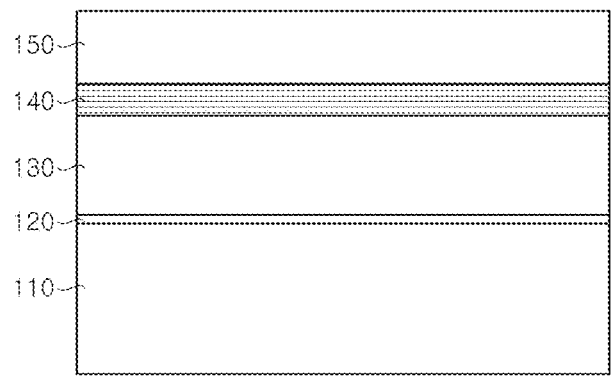

Referring to FIG. 6, the light absorption layer 150 is formed on the low-current blocking layer 140. The light absorption layer 150 may include a nitride semiconductor and may be grown by selectively applying elements and compositions of the nitride semiconductor depending upon a wavelength of light to be detected by the photo-detecting device. For example, the light absorption layer 150 including a GaN layer or an InGaN layer may be grown for a photo-detecting device configured to detect UV light in the UVA band. The light absorption layer 150 including an AlGaN layer having an Al ratio of 28% or less may be grown for a photo-detecting device configured to detect UV light in the UVB band. The light absorption layer 150 including an AlGaN layer having an Al ratio of 28% to 50% may be grown for a photo-detecting device configured to detect UV light in the UVC band. It is contemplated, however, that exemplary embodiments are not limited thereto.

In exemplary embodiments, the light absorption layer 150 may be grown to a thickness of 0.1 μm or more, and thus the manufactured photo-detecting device may have improved photo-detection efficiency.

Figure 7:
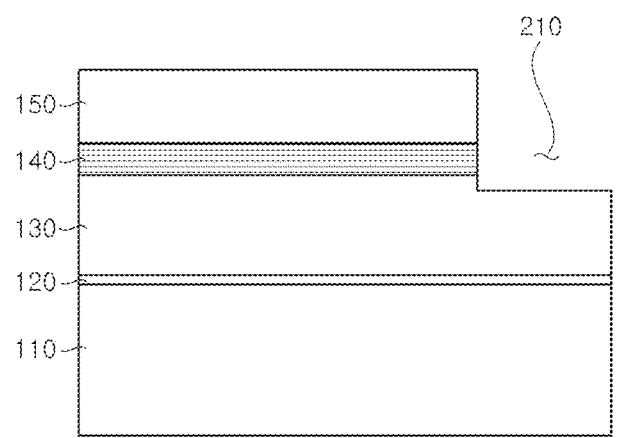

Referring to FIG. 7, the first nitride layer 130 may be partially exposed by partially removing the light absorption layer 150 and the low-current blocking layer 140. In addition, a portion of the first nitride layer 130 under the exposed portion may be further removed in a thickness direction.

The light absorption layer 150 and the low-current blocking layer 140 may be partially removed by photolithography and etching, for example, dry etching. It is contemplated, however, that any other suitable methodology may be utilized in association with exemplary embodiments described herein.

Figure 8:
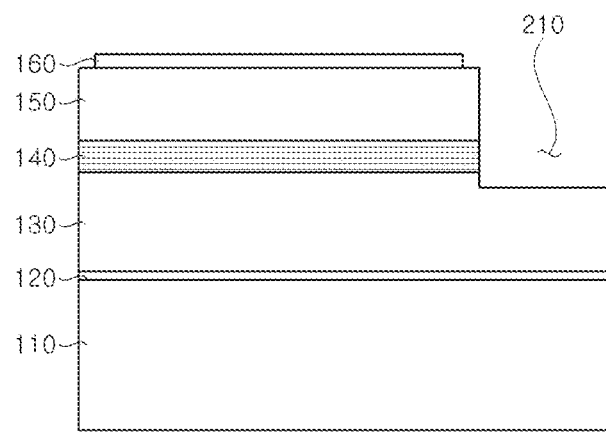

Referring to FIG. 8, a Schottky junction layer 160 is formed on the light absorption layer 150. The Schottky junction layer 160 may be formed by deposition (or other formation) of a substance including at least one of ITO, Ni, Co, Pt, W, Ti, Pd, Ru, Cr, and Au. The thickness of the Schottky junction layer 160 may be adjusted in terms of light transmittance and Schottky characteristics, and, may be, for example, 10 nm or less in thickness.

In addition, the manufacturing method may further include forming a cap layer (not shown) between the Schottky junction layer 160 and the light absorption layer 150. The cap layer may be formed by growing a p-type-doped nitride semiconductor layer containing an impurity such as, for example, Mg. The cap layer may have a thickness of 100 nm or less, such as, 5 nm or less. The cap layer may improve the Schottky characteristics of the device.

Next, a first electrode 171 and a second electrode 173 are formed on the Schottky junction layer 160 and the exposed area of the first nitride layer 130, respectively, as seen in FIG. 1. The first and second electrodes 171 and 173 may be formed by deposition (or other formation) of metallic materials and lift-off, and may also be composed of multiple layers. For example, the first electrode 171 may be formed by stacking at least one of Ni and Au layers, and the second electrode 173 may be formed by stacking at least one of Cr, Ni, and Au layers. It is contemplated, however, that exemplary embodiments are not limited thereto.

Figure 9:
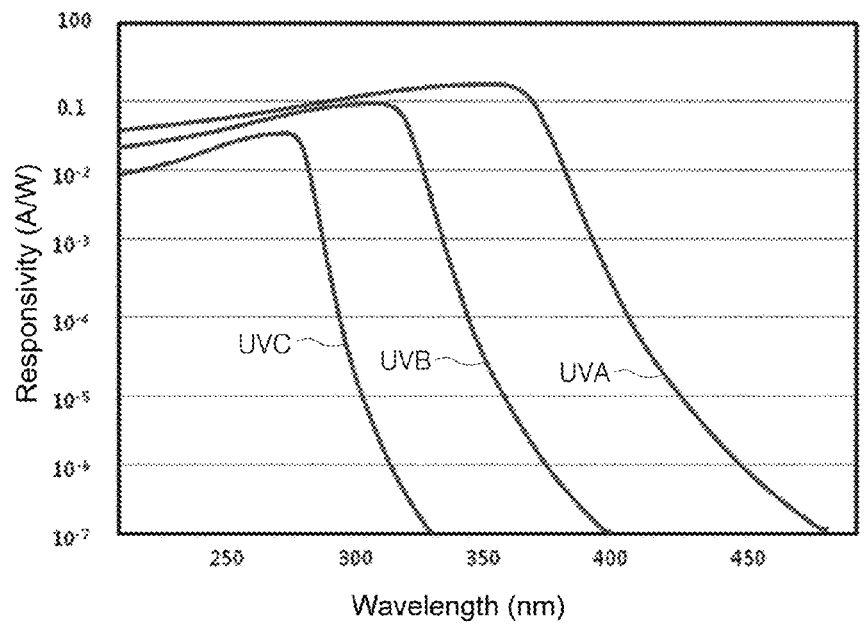
FIG. 9 is a graph comparing characteristics of a photo-detecting device according to exemplary embodiments.

FIG. 9 is a graph comparing responsivity of photo-detecting devices depending upon wavelengths, according to exemplary embodiments. The photo-detecting devices used in FIG. 9 include features of the exemplary embodiments described herein. The UVA photo-detecting device includes a GaN layer as the light absorption layer 150, the UVB photo-detecting device includes an AlGaN layer having an Al ratio of 28% as the light absorption layer 150, and the UVC photo-detecting device includes an AlGaN layer having an Al ratio of 50% as the light absorption layer 150.

The photo-detecting devices have high responsivity, as shown in FIG. 9. UV-to-visible light rejection ratios of the photo-detecting devices are calculated on the basis of measurement results on responsivity obtained by illuminating the photo-detecting devices with a white light emitting diode (LED) having a peak wavelength of 600 nm, and the calculation results show that all of these photo-detecting devices have UV-to-visible light rejection ratios of $10^4$ or higher.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A photo-detecting device, comprising:
a first nitride layer;
a light absorption layer disposed on the first nitride layer; and
a Schottky junction layer disposed on the light absorption layer,
wherein, according to a photoluminescence (PL) properties measurement of the photo-detecting device, a first peak light intensity is greater than a second peak light intensity, and
wherein the first peak light intensity is a peak light intensity of light emitted from the light absorption layer, and the second peak light intensity is a peak light intensity of light emitted from the first nitride layer.

2. The photo-detecting device of claim 1, further comprising:
a low-current blocking layer interposed between the light absorption layer and the first nitride layer, the low-current blocking layer comprising a multilayer structure.

3. The photo-detecting device of claim 2, wherein:
the multilayer structure comprises at least one of binary, ternary, and quaternary nitride layers comprising (Al, In, Ga)N; and
the multilayer structure comprises at least two alternately stacked nitride layers having different composition ratios.

4. The photo-detecting device of claim 1, wherein the second peak light intensity is 50% or less than that of the first peak light intensity.

5. The photo-detecting device of claim 1, wherein light applied to the photo-detecting device for the PL properties measurement comprises a neodymium-doped yttrium aluminum garnet (Nd:YAG) pulsed laser beam.

6. The photo-detecting device of claim 1, wherein the first nitride layer has a greater thickness than the light absorption layer.

7. The photo-detecting device of claim 1, wherein the first nitride layer comprises gallium nitride (GaN) and the light absorption layer comprises aluminum gallium nitride (AlGaN).

8. The photo-detecting device of claim 1, wherein the light absorption layer comprises a thickness in a range of 0.1 µm to 0.5 µm.

9. A photo-detecting device, comprising:
a first nitride layer;
a light absorption layer disposed on the first nitride layer; and
a Schottky junction layer disposed on the light absorption layer,
wherein:
the light absorption layer is configured to emit light having a first peak light intensity;
the first nitride layer is configured to emit light having a second peak light intensity; and
the first peak light intensity is greater than the second peak light intensity.

10. The photo-detecting device of claim 9, further comprising a low-current blocking layer interposed between the light absorption layer and the first nitride layer, the low-current blocking layer comprising a multilayer structure.

11. The photo-detecting device of claim 10, wherein the second peak light intensity is 50% or less than that of the first peak light intensity.

12. The photo-detecting device of claim 9, wherein:
the first and second peak light intensities are configured to be determined by a photoluminescence (PL) properties measurement of the photo-detecting device; and
light is configured to be applied to the photo-detecting device for the PL properties measurement using a neodymium-doped yttrium aluminum garnet (Nd:YAG) pulsed laser beam.

13. The photo-detecting device of claim 9, wherein the first nitride layer has a greater thickness than the light absorption layer.

14. The photo-detecting device of claim 9, wherein the first nitride layer comprises gallium nitride (GaN) and the light absorption layer comprises aluminum gallium nitride (AlGaN).

15. The photo-detecting device of claim 9, wherein the light absorption layer comprises a thickness in a range of 0.1 µm to 0.5 µm.

16. The photo-detecting device of claim 10 wherein:
the multilayer structure comprises at least one of binary, ternary, and quaternary nitride layers comprising (Al, In, Ga)N; and
the multilayer structure comprises at least two alternately stacked nitride layers having different composition ratios.

* * * * *